(12) United States Patent
Turpin et al.

(10) Patent No.: US 9,164,131 B2
(45) Date of Patent: Oct. 20, 2015

(54) SIGNAL RECOGNITION AND TRIGGERING USING COMPUTER VISION TECHNIQUES

(75) Inventors: John F. Turpin, Tigard, OR (US); Kathryn A. Engholm, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 57 days.

(21) Appl. No.: 12/779,732

(22) Filed: May 13, 2010

(65) Prior Publication Data

US 2011/0280489 A1 Nov. 17, 2011

(51) Int. Cl.
*G06K 9/62* (2006.01)
*G01R 13/02* (2006.01)

(52) U.S. Cl.
CPC .......... *G01R 13/0254* (2013.01); *G01R 13/029* (2013.01)

(58) Field of Classification Search
CPC .......................... G01R 13/0254; G01R 13/029
USPC ........... 342/162, 195; 356/326, 303; 382/103, 382/209
See application file for complete search history.

(56) References Cited

U.S. PATENT DOCUMENTS

| | | | |
|---|---|---|---|
| 5,613,039 A * | 3/1997 | Wang et al. ................. 706/24 |
| 5,644,331 A | 7/1997 | Hazama |
| 5,796,868 A * | 8/1998 | Dutta-Choudhury ......... 382/199 |
| 6,173,074 B1 * | 1/2001 | Russo ........................... 382/190 |
| 6,404,923 B1 | 6/2002 | Chaddha et al. |
| 6,434,515 B1 | 8/2002 | Qian |
| 6,975,687 B2 * | 12/2005 | Jackson et al. ................ 375/297 |
| 7,362,814 B2 * | 4/2008 | Sugar ............................ 375/261 |
| 7,459,898 B1 | 12/2008 | Woodings |
| 7,561,090 B1 * | 7/2009 | Muenter et al. ............... 341/155 |
| 7,570,305 B2 * | 8/2009 | Joskin ........................... 348/572 |
| 7,664,333 B2 | 2/2010 | Kasutani et al. |
| 7,801,476 B2 * | 9/2010 | Feenstra et al. .............. 455/3.01 |
| 8,036,468 B2 * | 10/2011 | Chrysanthakopoulos .... 382/225 |
| 8,283,623 B2 * | 10/2012 | Li ............................ 250/227.23 |
| 8,379,703 B2 | 2/2013 | Nara |
| 2003/0165259 A1 | 9/2003 | Balent et al. |
| 2005/0244033 A1 * | 11/2005 | Ekin et al. ...................... 382/103 |
| 2005/0276462 A1 * | 12/2005 | Silver et al. ................... 382/141 |

(Continued)

FOREIGN PATENT DOCUMENTS

| | | |
|---|---|---|
| EP | 0677746 A2 | 10/1995 |
| JP | 2003084037 | 3/2003 |

(Continued)

OTHER PUBLICATIONS

Venayagamoorthy; Ganesh, et al., "Voice recognition using neural networks," IEEE, 1998, pp. 29-32.

(Continued)

*Primary Examiner* — Gregory M Desire
(74) *Attorney, Agent, or Firm* — Michael A. Nelson; Andrew J. Harrington; Marger Johnson

(57) ABSTRACT

A test and measurement instrument processes digital data that represents an input signal to produce a target image, and then uses a computer vision technique to recognize a signal depicted within the target image. In some embodiments, the location of the signal within the target image is identified on a display device. In other embodiments, the location of the signal within the target image is used to perform a measurement. In other embodiments, when the signal is recognized, a trigger signal is generated that causes digital data that represents the input signal to be stored in a memory.

38 Claims, 7 Drawing Sheets

(56) References Cited

U.S. PATENT DOCUMENTS

| | | | |
|---|---|---|---|
| 2006/0065844 A1* | 3/2006 | Zelakiewicz et al. | 250/370.09 |
| 2006/0114322 A1* | 6/2006 | Romanowich et al. | 348/143 |
| 2006/0132353 A1* | 6/2006 | Natsume et al. | 342/147 |
| 2006/0281429 A1* | 12/2006 | Kishi et al. | 455/313 |
| 2007/0213618 A1* | 9/2007 | Li et al. | 600/476 |
| 2008/0144899 A1* | 6/2008 | Varma et al. | 382/129 |
| 2009/0012387 A1* | 1/2009 | Hanson et al. | 600/411 |
| 2009/0034793 A1 | 2/2009 | Dong et al. | |
| 2009/0082982 A1 | 3/2009 | Cain | |
| 2012/0069341 A1* | 3/2012 | Mullen et al. | 356/445 |

FOREIGN PATENT DOCUMENTS

| | | |
|---|---|---|
| WO | 9117525 A1 | 11/1991 |
| WO | 9319378 A1 | 9/1993 |
| WO | 9422025 A1 | 9/1994 |
| WO | 2004095758 A2 | 11/2004 |
| WO | 2010049686 A1 | 5/2010 |

OTHER PUBLICATIONS

Mellinger; David, et al., "Recognizing transient low-frequency whale sounds by spectrogram correlation," J. Acoust. Soc. Am. 107 (6), Jun. 2000, pp. 3518-3529.

Elliot; Tom, "Classify Digital RF Signals in the Field," Microwaves & RF, ED Online ID #20586, Jan. 2009, available at http://www.mwrf.com/Articles/Index.cfm?Ad=1&ArticleID=20586.

Paragios; Nikos, et al., "Geodesic Active Contours for Supervised Texture Segmentation," 1063-6919/99, 1999, IEEE.

Xu Mankun, et al., "A New Time-Frequency Spectrogram Analysis of FH Signals by Image Enhancement and Mathematical Morphology," IEEE Fourth International Conference on Image and Graphics (ICIG 2007), Aug. 1, 2007, pp. 610-615, IEEE, Piscataway, NJ, USA.

\* cited by examiner

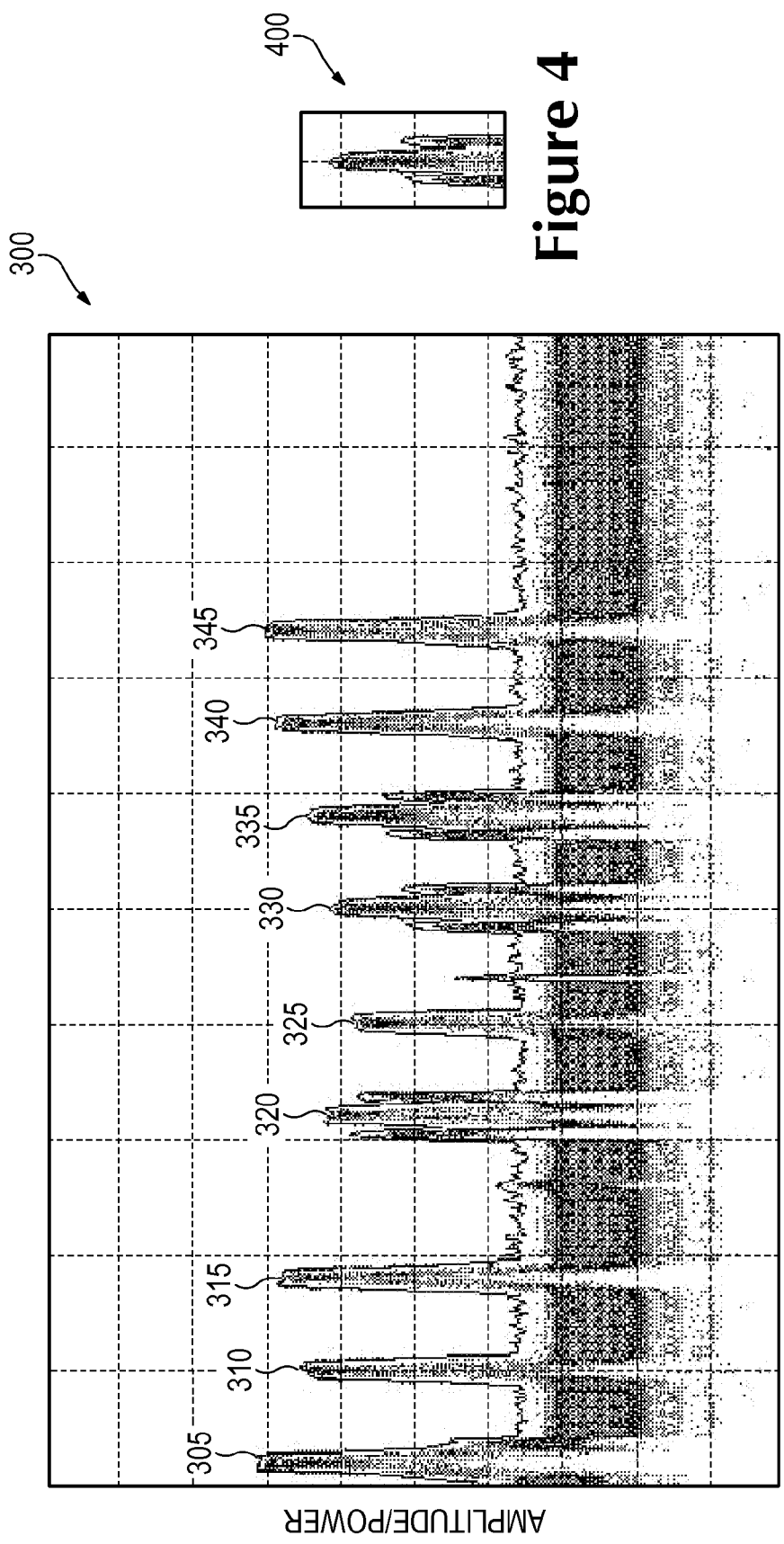

SIGNAL RECOGNITION AND TRIGGERING USING COMPUTER VISION TECHNIQUES

FIELD OF THE INVENTION

The present invention relates to test and measurement instruments, and more particularly to the processing of acquired signals.

BACKGROUND OF THE INVENTION

Real-time spectrum analyzers such as the RSA6100 and RSA3400 families available from Tektronix, Inc. of Beaverton, Oreg. trigger on, capture, and analyze RF signals in real-time. These test and measurement instruments seamlessly capture RF signals so that, unlike conventional swept spectrum analyzers and vector signal analyzers, no data is missed within a specified bandwidth.

An experienced user can look at a display of a real-time spectrum analyzer and recognize different types of signals based on their visual appearance. For example, an experienced user can observe a signal's bandwidth, duration, amplitude or power, the number and shape of its spectral lobes, and other visual clues, and based on that, determine whether the signal is modulated according to a particular modulation standard, whether the signal was transmitted by a particular transmitter, and so on. The user may then use that information to select an appropriate measurement for the signal.

However, requiring a user to recognize a signal can be time-consuming and inconvenient for the user. Furthermore, in some cases, an inexperienced user may need to identify a signal but lack the expertise to do so.

SUMMARY OF THE INVENTION

The inventors of the present invention have recognized that, in order to overcome the deficiencies of the prior art discussed above, what is needed is a test and measurement instrument that is capable of automatically recognizing signals without any user intervention.

Accordingly, embodiments of the present invention provide a test and measurement instrument that processes digital data that represents an input signal to produce a target image, and then uses a computer vision technique to recognize a signal depicted within the target image. In some embodiments, the location of the signal within the target image is identified on a display device. In other embodiments, the location of the signal within the target image is used to perform a measurement. In other embodiments, when the signal is recognized, a trigger signal is generated that causes digital data that represents the input signal to be stored in a memory.

The objects, advantages, and other novel features of the present invention are apparent from the following detailed description when read in conjunction with the appended claims and attached drawings.

BRIEF DESCRIPTION OF THE DRAWINGS

FIG. 3 depicts a target image.

FIG. 4 depicts a reference image.

DETAILED DESCRIPTION OF THE INVENTION

Figure 1:
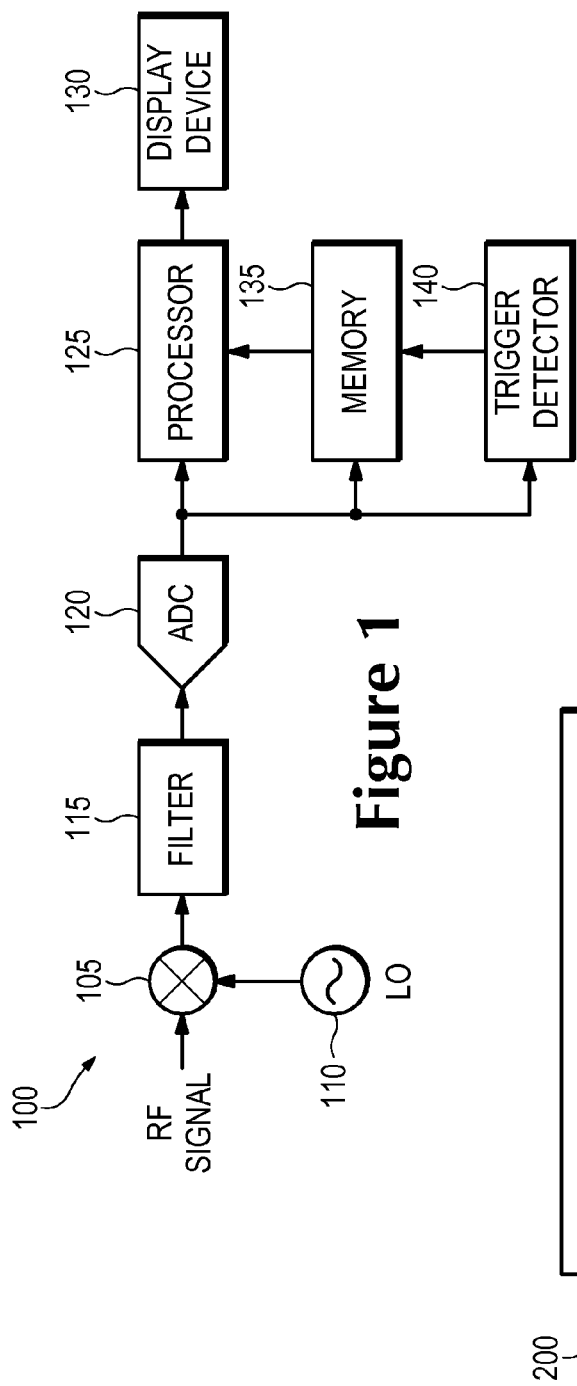
FIG. 1 depicts a high-level block diagram of a real-time spectrum analyzer.

Referring now to FIG. 1, a real-time spectrum analyzer 100 receives a radio frequency (RF) input signal and optionally down-converts it using a mixer 105, local oscillator (LO) 110, and filter 115 to produce an intermediate frequency (IF) signal. An analog-to-digital converter (ADC) 120 digitizes the IF signal to produce a continuous stream of digital data that represents the IF signal. The digital data is processed in two paths. In the first path, the digital data is input to a processor 125 that analyzes the digital data in real-time by converting it into a data structure referred to as an "image" and then optionally performing one or more measurements based on that image. In the second path, the digital data is input to a memory 135 (which, in some embodiments, comprises a circular buffer) and also input to a trigger detector 140 that processes the digital data in real-time and compares the processed data to a user-specified trigger criterion. When the processed digital data satisfies the trigger criterion, the trigger detector 140 generates a trigger signal that causes the memory 135 to store a block of digital data. The processor 125 then analyzes the stored digital data by converting it into an image and then optionally performing one or more measurements based on that image. The images and any measurements may be displayed on the display device 130 or stored in a storage device (not shown).

An "image" is a data structure that depicts any one of various visualizations of the input signal. One such visualization is a "frequency spectrum." A frequency spectrum is formed by transforming a frame of the digital data into the frequency domain using a frequency transform such as a fast Fourier transform, a chirp-Z transform, or the like.

Tektronix real-time spectrum analyzers use a technology referred to as "Digital Phosphor" or alternatively as "DPX®" to produce a specialized frequency spectrum referred to as a "DPX spectrum." A DPX spectrum is formed by transforming the continuous stream of digital data into a series of frequency spectra in real-time, and then accumulating the frequency spectra in a database. The database provides a precise measurement of the percentage of time during the measurement period that the input signal occupied particular locations in the amplitude or power versus frequency space, also referred to as "density." A DPX spectrum is commonly displayed with the x-axis being frequency, the y-axis being amplitude or power, and the z-axis being density, represented by the color or intensity of each point in the power versus frequency space. DPX acquisition and display technology reveals signal details such as short-duration or infrequent events that are completely missed by conventional spectrum analyzers and vector signal analyzers. For more information on DPX, see Tektronix document number 37W-19638 titled "DPX® Acquisition Technology for Spectrum Analyzers Fundamentals" available at http://www.tek.com/.

Another such visualization is a "spectrogram." A spectrogram is formed by transforming frames of the digital data into a series of colored lines representing frequency spectra and then laying each line "side-by-side" to form an image, with each "slice" of the image corresponding to one frequency spectrum. A spectrogram is commonly displayed with the x-axis being frequency, the y-axis being time, and different amplitude or power values within the time versus frequency space being indicated by different colors or intensities. A spectrogram provides an intuitive visualization of how frequency and amplitude or power behavior change over time.

Figure 2:
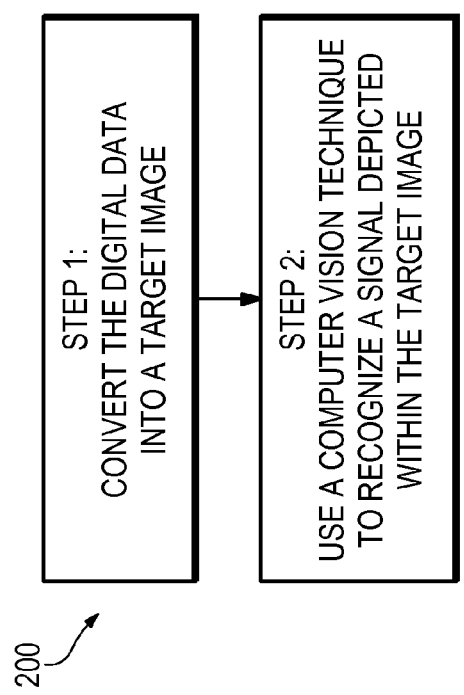
FIG. 2 depicts a flowchart of a method according to an embodiment of the present invention.

Referring now to FIG. 2, in some embodiments of the present invention, the processor 125 processes the digital data by performing the steps of (1) converting the digital data into an image referred to as a "target image," and (2) using a computer vision technique to recognize a signal depicted within the target image.

"Computer vision" refers to the theory of artificial systems that extract information from images, or in other words, computers that "see." One particular application of computer vision is "object recognition," which is the task of determining whether an image depicts a specified object. As an example, a digital camera such as the EOS 50D available from Canon Inc. of Ōta, Tokyo, Japan uses object recognition to automatically determine whether an image formed by the camera's field of view depicts a human face, a feature referred to as "face detection."

Various object recognition techniques exist. In one object recognition technique referred to as "template matching," a first image referred to as a "target image" is searched for regions that are similar to a second image referred to as a "reference image." The search is typically performed using two-dimensional correlation.

The following example illustrates how template matching can be used to recognize a signal depicted within a target image. FIG. 3 depicts an image of a DPX spectrum 300 of an input signal that contains power at several frequencies, corresponding to multiple broadcast channels in the FM radio band. Signals 320, 330, and 335 are HD Radio® signals (specifically, in-band on-channel, also referred to as "IBOC") which are both analog and digital, and signals 305, 310, 315, 325, 340, and 345 are only analog. In this example, the objective is to use template matching to recognize the HD signals depicted within the frequency spectrum 300 using signal 330 as a model of an HD signal. Thus, the target image is the image of the frequency spectrum 300, and the reference image is the portion of the frequency spectrum 300 that corresponds to the HD signal 330, specifically the image 400 shown in FIG. 4.

Figure 5:
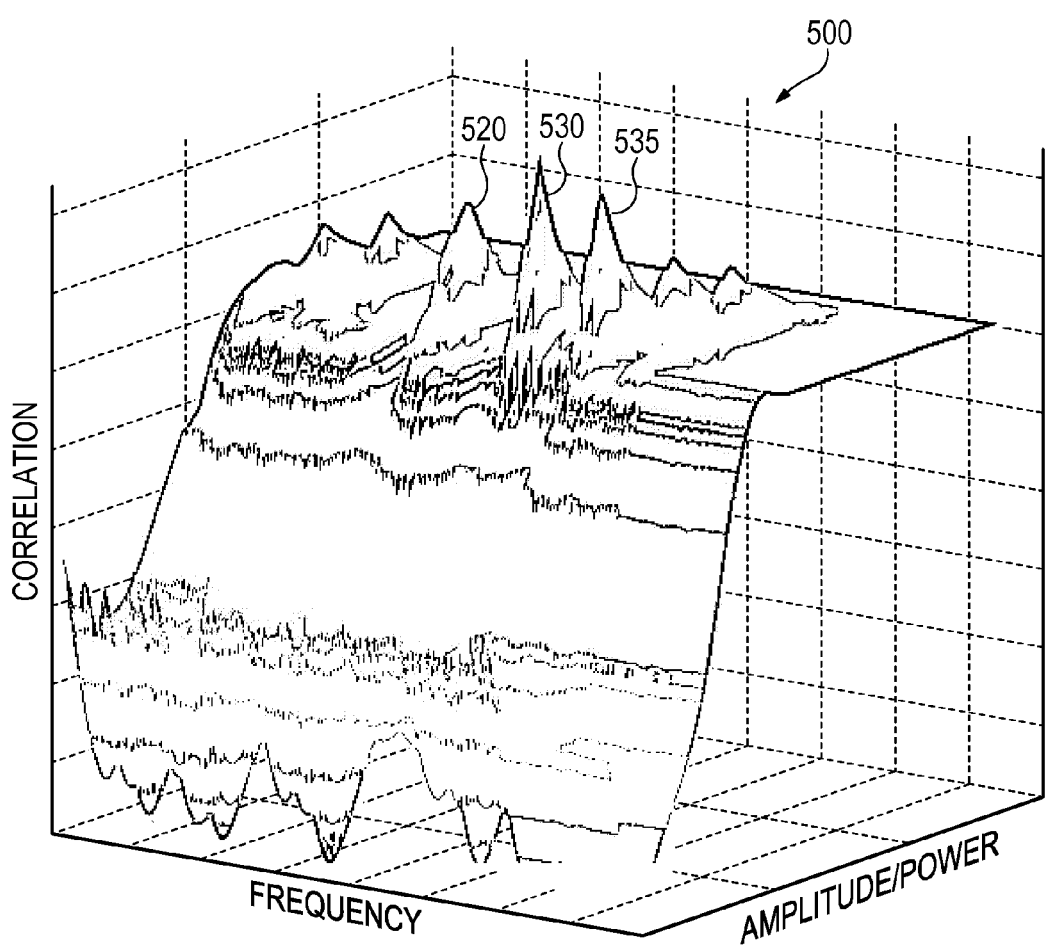
FIG. 5 depicts the result of correlating the target image of FIG. 3 with the reference image of FIG. 4.
Figure 6:
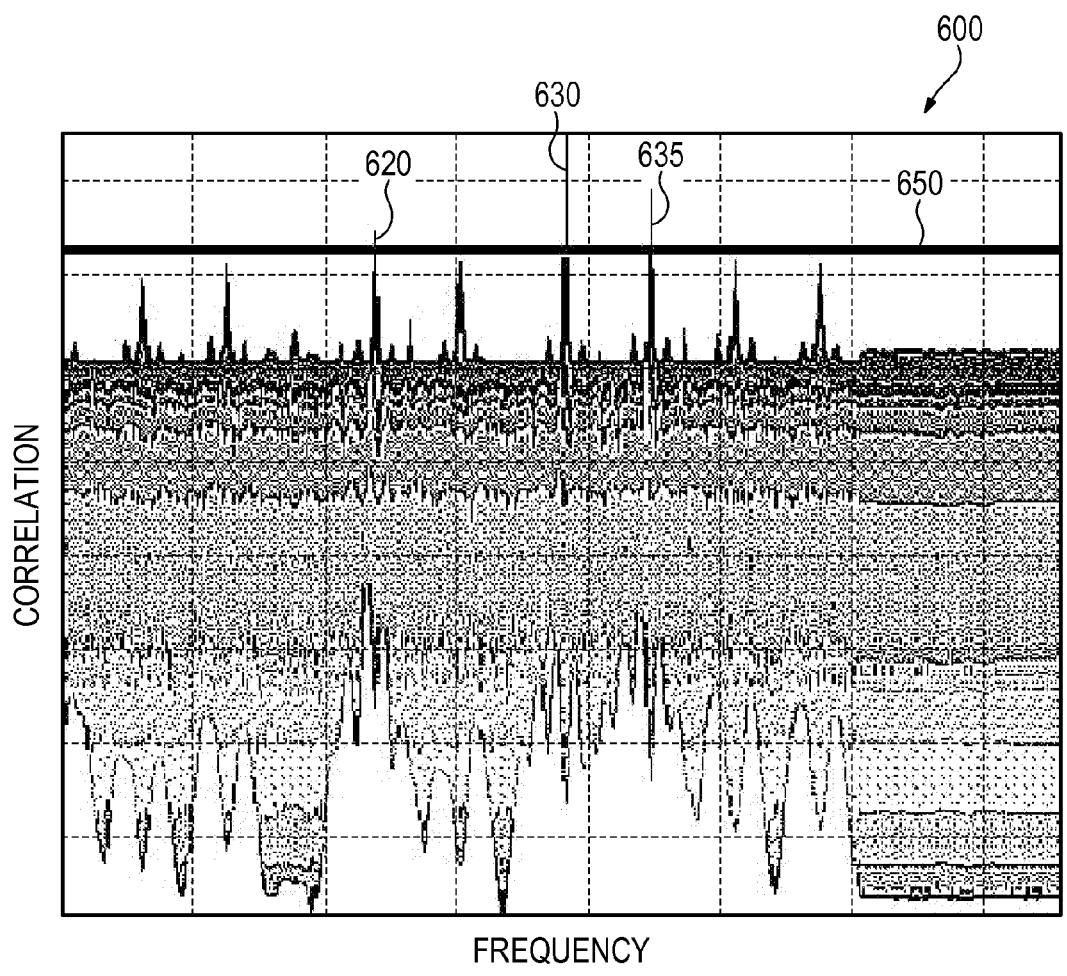
FIG. 6 depicts an alternative view of the result shown in FIG. 5.

Correlating the reference image 400 over the entire target image 300 with a two-dimensional correlation yields the result 500 shown in FIG. 5. The largest peak 530 corresponds to the HD signal 330, which is identical to the reference image 400. The next two largest peaks 520 and 535 correspond to the other two HD signals 320 and 335, which are similar but not identical to the reference image 400. The smaller peaks correspond to the non-HD signals, which are not similar to the reference image 400. FIG. 6 shows another view 600 of the result of the correlation 500 from a different perspective. The peaks 620, 630, and 635 can be identified in various ways, for example, by comparing them to a correlation threshold 650. Peaks that exceed the correlation threshold 650 are deemed to be sufficiently similar to the reference image 400 to be "recognized" as defining the locations of HD signals.

Figure 7:
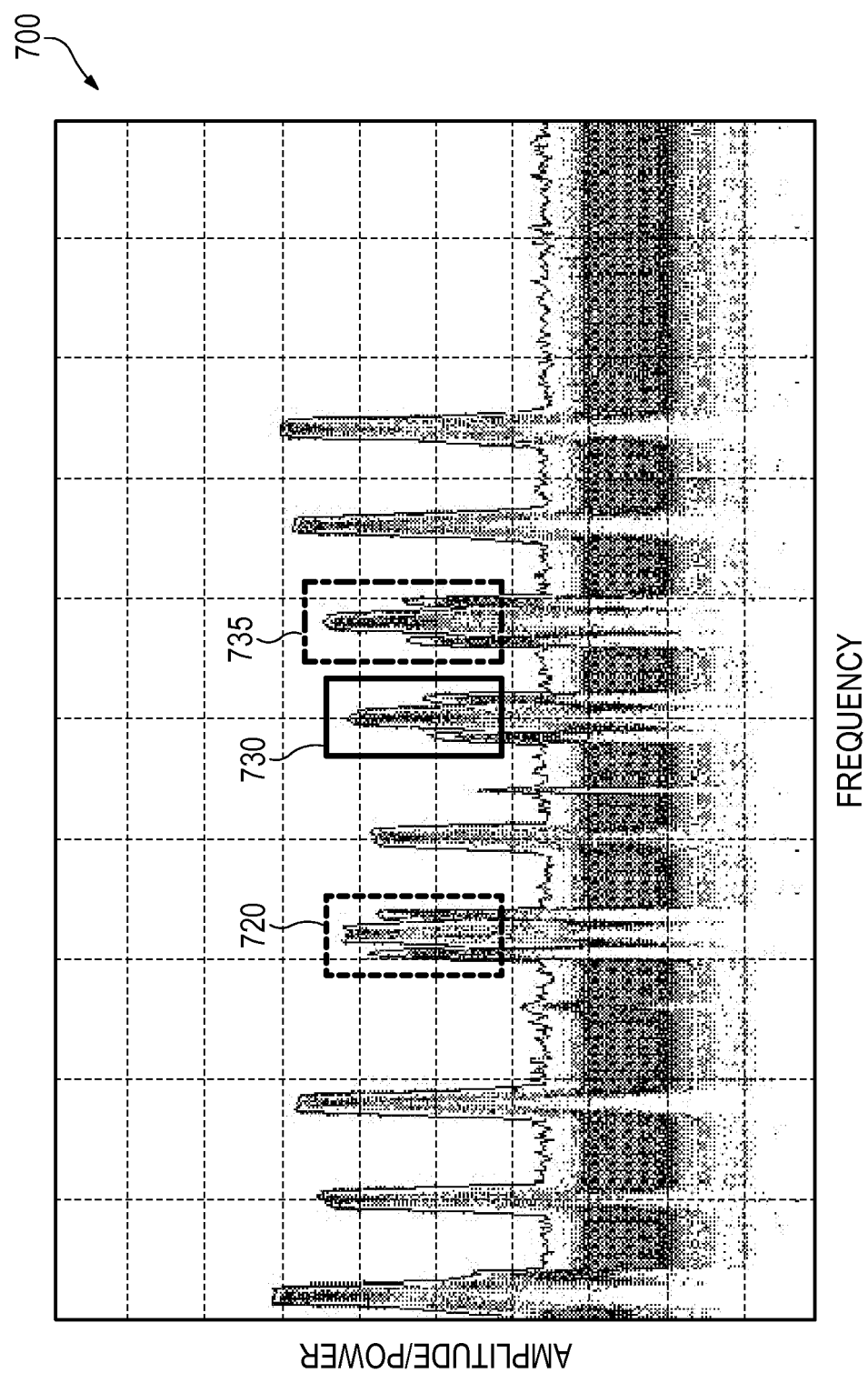
FIG. 7 depicts the locations of recognized signals within the target image of FIG. 3.

In some embodiments, the location of a recognized signal is identified visually on the display device 130. For example, as shown in FIG. 7, boxes 720, 730, and 735 indicate the locations of the HD signals within the frequency spectrum 700, with the degree of similarity to the reference image 400 being indicated by the color or intensity of the frame of the box.

Figure 8:
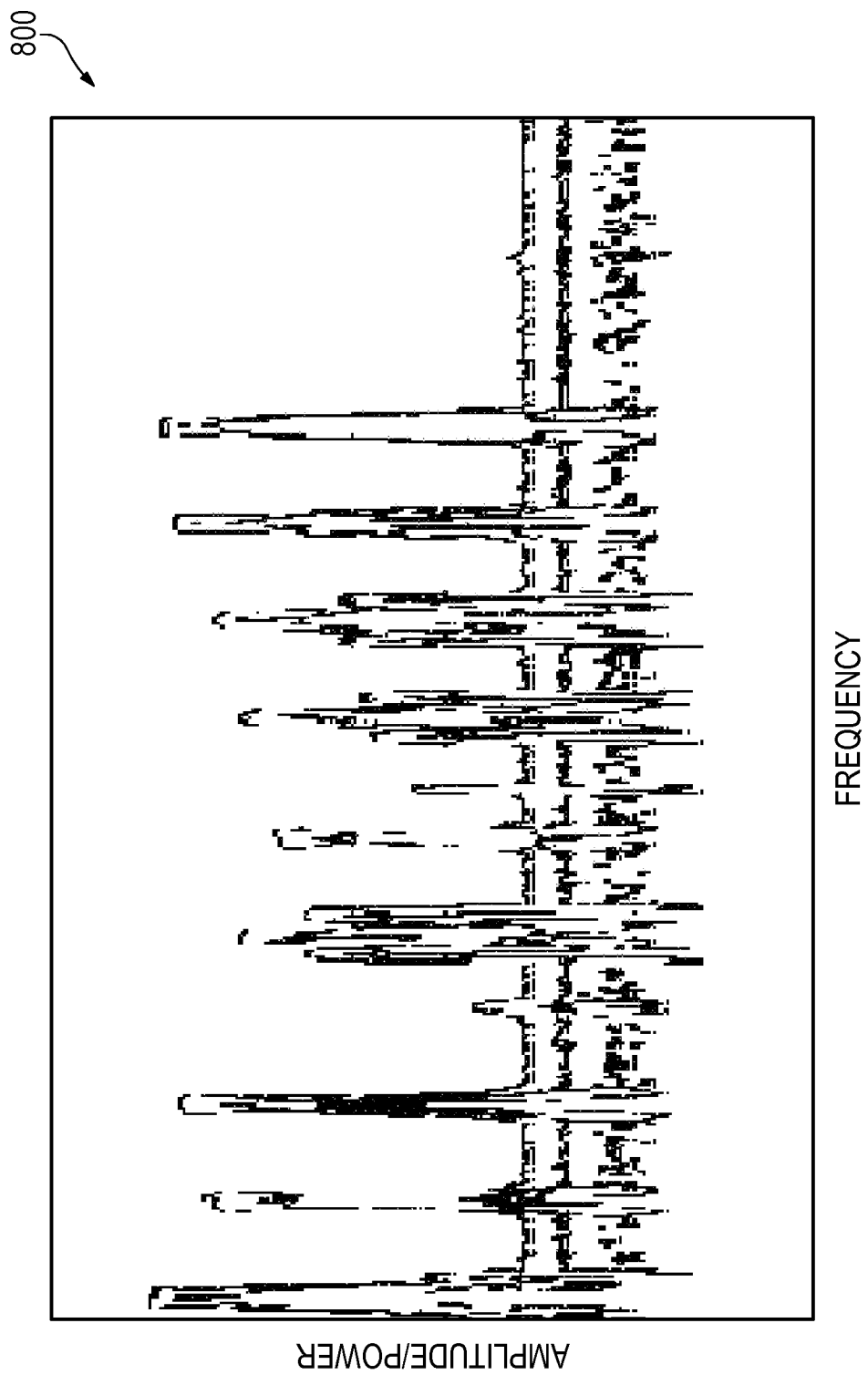
FIG. 8 depicts the target image of FIG. 3 after the application of edge detection.

In some embodiments, the accuracy of the computer vision technique is enhanced by applying any one of various image processing techniques to the reference image and/or the target image before the computer vision technique. One such image processing technique, "edge detection," may be used to detect the features of the reference image and the target image, thereby filtering out less relevant information while preserving the important structural properties. For example, after edge detection, the frequency spectrum 300 shown in FIG. 3 appears as shown in FIG. 8. Note the dominance of noise in the signals, which could be reduced by smoothing or filtering prior to edge detection, and the artifacts under each signal representing "uplift" effects in the noise floor.

Figure 9:
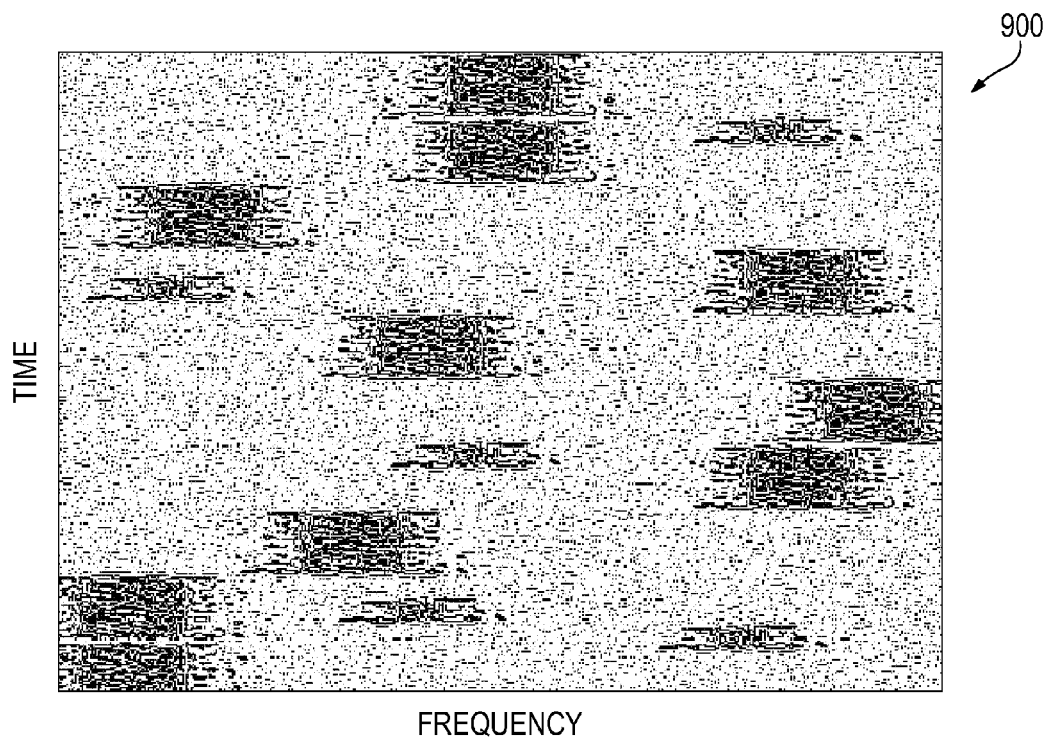
FIG. 9 depicts a target image.
Figure 10:
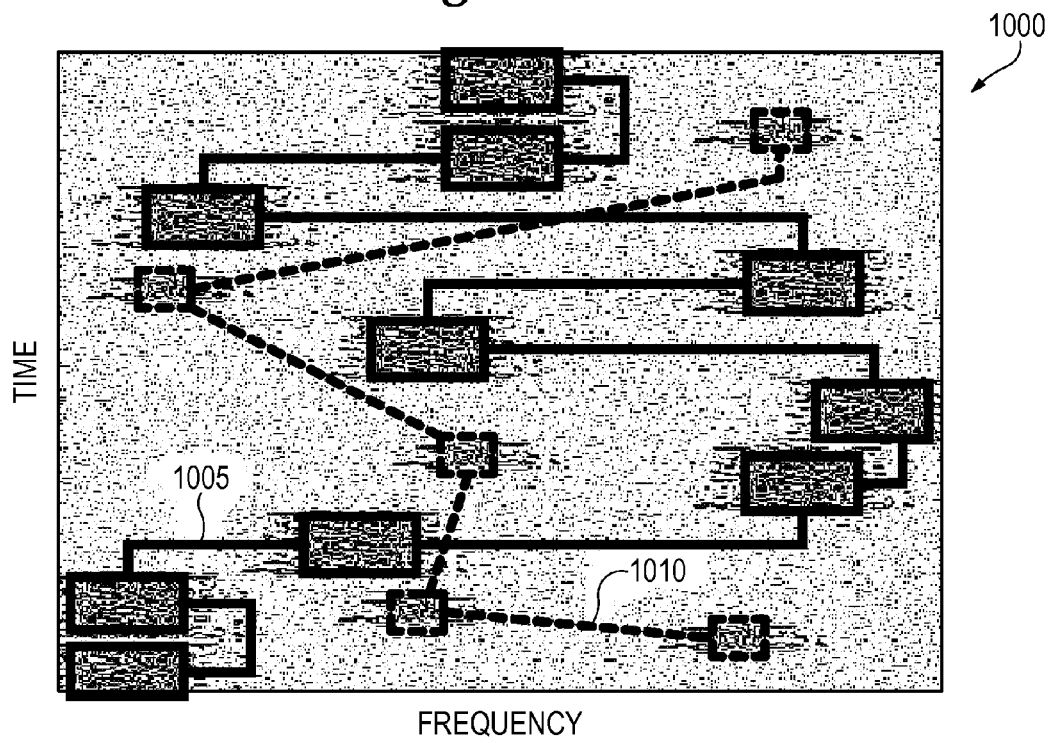
FIG. 10 depicts the locations of recognized signals within the target image of FIG. 9.

In some embodiments, the target image depicts a spectrogram as shown in FIG. 9. In this case, a computer vision technique is particularly useful for recognizing groups of similar signals from among a larger field of signals. For example, as shown in FIG. 10, a computer vision technique can be used to recognize signals having similar bandwidths and durations, and thereby recognize two sequences of hopping signals 1005 and 1010.

It will be appreciated that the target image is not limited to depicting a frequency spectrum or a spectrogram as described above, but in general may depict any visualization of the input signal. The visualization may depict the input signal in any domain such as the frequency domain, the time domain, the modulation domain, the code domain, and the statistical domain. Frequency domain visualizations include frequency spectra, spectrograms, and the like. Time domain visualizations include graphs of frequency versus time, amplitude or power versus time, phase versus time, I/Q versus time, eye diagrams, and the like. Modulation domain visualizations include constellation diagrams and the like. Code domain visualizations include "codograms" and the like. Statistical domain visualizations include graphs of complementary cumulative distribution functions and the like.

In some embodiments, the location of a recognized signal within a target image is used to perform a measurement. That is, the location of the recognized signal within the target image may be input to a measurement and used to identify a signal automatically rather than requiring the user to manually identify it by, for example, placing a cursor on it. For example, after recognizing the HD signals 320, 330, and 335 of FIG. 3, the processor 125 may use the locations of those signals within the frequency spectrum 300 to automatically measure channel spacing (the distance between the horizontal centers of the recognized signals), occupancy (the average density value of each of the recognized signals), and so on. Similarly, after recognizing the individual bursts of energy that make up the two sequences of hopping signals 1005 and 1010 of FIG. 10, the processor 125 may use the locations of those bursts of energy within the spectrogram 1000 to automatically measure pulse bandwidth (the width of each burst of energy), hop duration (the length of each burst of energy), the off time of the transmitter (the vertical distance between the bottom of one burst of energy and the top of the next burst of energy in the same group), hop width (the horizontal distance between the centers of two bursts of energy), and so on. It will be appreciated that the location of a recognized signal within a target image can be used to automate many of the other measurements available on a real-time spectrum analyzer such as channel frequency, channel bandwidth, peak amplitude, pulse hop distance, repetition interval, and so on.

In the embodiments described above, the processor 125 recognizes a signal based on one reference image. Alternatively, in other embodiments, the processor 125 recognizes a signal based on a plurality of reference images, each of which corresponds to a portion of the signal.

In some embodiments, the processor 125 converts the digital data into a plurality of sequential target images and recognizes a signal within each target image. For example, the processor 125 may recognize a first signal within a first target image, a second signal within a second target image, and so on. Alternatively, the processor 125 may recognize a first signal within a specified number of target images, a second signal within the next specified number of target images, and so on. In this manner, the processor 125 can recognize the time-evolution of a signal such as a sequential test pattern.

In some embodiments, the processor 125 only searches within a specified region of the target image. For example, in the case where the target image is a spectrogram, constraining the search to a specified region of the target image is equivalent to constraining the search to a particular frequency range, a particular time range, or a particular region in the time versus frequency space.

In the embodiments described above, the processor 125 recognizes a signal by determining that a portion of the target image is similar to a reference image. In other embodiments, the processor 125 recognizes a signal by determining that a specified portion of the target image is not similar to a reference image, or in other words, determining that the specified portion of the target image does not appear as expected.

In some embodiments, the search is constrained to signals having a specified amplitude or power. For example, in the case where the target image is a spectrogram, where different amplitude or power values are indicated by different colors, the target image may be constrained to signals having a particular color.

In various embodiments, the reference image may be an image of a previously recognized signal, an image supplied by the user, or an image defined by a standard. In various embodiments, the reference image may be specified by a user, defined by a standard, or automatically determined by the processor 125.

In some embodiments, a command or a button is provided to the user that causes the processor 125 to store a portion of an image for use as a reference image.

In some embodiments, the processor 125 periodically updates the reference image by replacing it with a portion of the current or a previous target image. For example, the user may specify that with each new target image, the processor 125 is to replace the reference image with a specified portion of the previous target image, or the target image before that, and so on. For another example, the user may specify that the processor 125 is to replace the reference image every five seconds with a specified portion of the then-current target image. In this manner, the processor 125 may track slowly-evolving changes in an input signal, thereby allowing it to recognize only sudden changes.

In some embodiments, the reference image is determined automatically by the processor 125 based on a library of stored reference images. In this case, the processor 125 tests the portion of the target image that contains a signal against the library of stored reference images to determine whether the signal is similar to one of the stored reference images. In this manner, the real-time spectrum analyzer 100 may automatically identify a signal that is unknown to a user.

In some embodiments, the trigger detector 140 processes the digital data by performing the steps of (1) converting the digital data into a target image, and (2) using a computer vision technique to recognize a signal depicted within the target image. When the trigger detector 140 recognizes the signal, it generates a trigger signal. As described above, the trigger signal causes the memory 135 to store a block of digital data. The stored digital data are then analyzed by the processor 125, and the results may be displayed on the display device 130 or stored in a storage device (not shown). In recognizing the signal, the trigger detector 140 may use any of the techniques described herein that the processor 125 uses. It will be appreciated that a user may use the trigger detector 140 to trigger on any characteristic of interest of a signal that can be depicted by an image rather than having to specify trigger criteria parametrically (e.g., trigger on a particular amplitude, frequency, or other property) as with conventional trigger detectors.

In various embodiments, the processor 125 and the trigger detector 140 may be implemented in hardware, software, or a combination of the two, and may comprise a general purpose microprocessor, a digital signal processor (DSP), an application specific integrated circuit (ASIC), a field-programmable gate array (FPGA), or the like.

Although the embodiments described above are described in the context of a real-time spectrum analyzer, it will be appreciated that the principles described herein are equally applicable to any test and measurement instrument that processes digital data that represents an input signal by converting it into an image such as a swept spectrum analyzer, a vector signal analyzer, and an oscilloscope.

It will be appreciated that a test and measurement instrument according to an embodiment of the present invention is not only capable of recognizing signals without any user intervention, but is also capable of recognizing signals more quickly, accurately, precisely, and consistently than a human user is capable of. For example, a test and measurement instrument according to an embodiment of the present invention is capable of recognizing a signal depicted within a DPX spectrum that has a density distribution, also referred to as a "density profile," that is specified more precisely than a human eye is capable of reliably discerning.

It will be appreciated from the foregoing discussion that the present invention represents a significant advance in the field of test and measurement equipment. Although specific embodiments of the invention have been illustrated and described for purposes of illustration, it will be understood that various modifications may be made without departing from the spirit and scope of the invention. Accordingly, the invention should not be limited except as by the appended claims.

What is claimed is:

1. A test and measurement instrument comprising:
an analog-to-digital converter for receiving a radio frequency (RF) input signal and producing a digital signal; and
a processor for converting digital data from the digital signal into a target image, and for using a computer vision technique to recognize a signal modulated according to a particular modulation standard depicted within the target image.

2. A test and measurement instrument as in claim 1 wherein the processor processes the digital data in real-time.

3. A test and measurement instrument as in claim 1 wherein the processor processes the digital data after it has been stored in a memory in response to a trigger signal.

4. A test and measurement instrument as in claim 1 wherein the location of the signal within the target image is identified on a display device.

5. A test and measurement instrument as in claim 1 wherein the location of the signal within the target image is used to perform a measurement.

6. A test and measurement instrument as in claim 1 wherein the computer vision technique comprises an object recognition technique.

7. A test and measurement instrument as in claim 6 wherein the object recognition technique comprises template matching, and the processor recognizes the signal based on a reference image.

8. A test and measurement instrument as in claim 7 wherein the processor recognizes the signal by determining that a portion of the target image is similar to the reference image.

9. A test and measurement instrument as in claim 7 wherein the processor recognizes the signal by determining that a portion of the target image is not similar to the reference image.

10. A test and measurement instrument as in claim 7 wherein the processor recognizes the signal based on a plurality of reference images, each of which corresponds to a portion of the signal.

11. A test and measurement instrument as in claim 7 wherein the processor converts the digital data into a plurality of sequential target images and recognizes a plurality of signals within the plurality of sequential target images.

12. A test and measurement instrument as in claim 7 wherein the processor periodically updates the reference image by replacing it with a portion of the current or a previous target image.

13. A test and measurement instrument as in claim 7 wherein the reference image is determined by the processor based on a library of stored reference images.

14. A test and measurement instrument as in claim 1 wherein the computer vision technique comprises an image processing technique.

15. A test and measurement instrument as in claim 1 wherein the target image depicts a frequency spectrum.

16. A test and measurement instrument as in claim 1 wherein the target image depicts a spectrogram.

17. A test and measurement instrument as in claim 1 wherein the target image depicts a visualization selected from the group consisting of a graph of frequency versus time, a graph of amplitude or power versus time, a graph of phase versus time, a graph of I/Q versus time, an eye diagram, a constellation diagram, a codogram, and a graph of a complementary cumulative distribution function.

18. A test and measurement instrument as in claim 1 wherein the processor searches for the signal within a specified region of the target image.

19. A test and measurement instrument as in claim 1 wherein the processor searches for a signal having a specified amplitude or power.

20. A test and measurement instrument as in claim 1 wherein the test and measurement instrument comprises a test and measurement instrument selected from the group consisting of a real-time spectrum analyzer, a vector signal analyzer, a swept spectrum analyzer, and an oscilloscope.

21. A test and measurement instrument comprising:
an analog-to-digital converter for receiving a radio frequency (RF) input signal and producing a digital signal;
a trigger detector for converting digital data from the digital signal into a target image, for using a computer vision technique to recognize a signal modulated according to a particular modulation standard depicted within the target image, and for generating a trigger signal when the signal is recognized; and
a memory for storing digital data from the digital signal in response to the trigger signal.

22. A test and measurement instrument as in claim 21 wherein the location of the signal within the target image is identified on a display device.

23. A test and measurement instrument as in claim 21 wherein the location of the signal within the target image is used to perform a measurement.

24. A test and measurement instrument as in claim 21 wherein the computer vision technique comprises an object recognition technique.

25. A test and measurement instrument as in claim 24 wherein the object recognition technique comprises template matching, and the trigger detector recognizes the signal based on a reference image.

26. A test and measurement instrument as in claim 25 wherein the trigger detector recognizes the signal by determining that a portion of the target image is similar to the reference image.

27. A test and measurement instrument as in claim 25 wherein the trigger detector recognizes the signal by determining that a portion of the target image is not similar to the reference image.

28. A test and measurement instrument as in claim 25 wherein the trigger detector recognizes the signal based on a plurality of reference images, each of which corresponds to a portion of the signal.

29. A test and measurement instrument as in claim 25 wherein the trigger detector converts the digital data into a plurality of sequential target images and recognizes a plurality of signals within the plurality of sequential target images.

30. A test and measurement instrument as in claim 25 wherein the trigger detector periodically updates the reference image by replacing it with a portion of the current or a previous target image.

31. A test and measurement instrument as in claim 25 wherein the reference image is determined by the trigger detector based on a library of stored reference images.

32. A test and measurement instrument as in claim 21 wherein the computer vision technique comprises an image processing technique.

33. A test and measurement instrument as in claim 21 wherein the target image depicts a frequency spectrum.

34. A test and measurement instrument as in claim 21 wherein the target image depicts a spectrogram.

35. A test and measurement instrument as in claim 21 wherein the target image depicts a visualization selected from the group consisting of a graph of frequency versus time, a graph of amplitude or power versus time, a graph of phase versus time, a graph of I/Q versus time, an eye diagram, a constellation diagram, a codogram, and a graph of a complementary cumulative distribution function.

36. A test and measurement instrument as in claim 21 wherein the trigger detector searches for the signal within a specified region of the target image.

37. A test and measurement instrument as in claim 21 wherein the trigger detector searches for a signal having a specified amplitude or power.

38. A test and measurement instrument as in claim 21 wherein the test and measurement instrument comprises a test and measurement instrument selected from the group consisting of a real-time spectrum analyzer, a vector signal analyzer, a swept spectrum analyzer, and an oscilloscope.

* * * * *